US012385741B2

(12) United States Patent
Garrido Alzar

(10) Patent No.: US 12,385,741 B2
(45) Date of Patent: Aug. 12, 2025

(54) DEVICE FOR MEASURING A QUANTITY REPRESENTATIVE OF A POPULATION OF COLD ATOMS AND ASSOCIATED SENSOR

(71) Applicants: CENTRE NATIONAL DE LA RECHERCHE SCIENTIFIQUE, Paris (FR); OBSERVATOIRE DE PARIS, Paris (FR); SORBONNE UNIVERSITE, Paris (FR)

(72) Inventor: Carlos Garrido Alzar, Paris (FR)

(73) Assignees: 1. CENTRE NATIONAL DE LA RECHERCHE SCIENTIFIQUE, Paris (FR); OBSERVATOIRE DE PARIS, Paris (FR); 3. SORBONNE UNIVERSITE, Paris (FR)

( * ) Notice: Subject to any disclaimer, the term of this patent is extended or adjusted under 35 U.S.C. 154(b) by 439 days.

(21) Appl. No.: 18/011,513

(22) PCT Filed: Jun. 18, 2021

(86) PCT No.: PCT/EP2021/066708
§ 371 (c)(1),
(2) Date: Dec. 19, 2022

(87) PCT Pub. No.: WO2021/259811
PCT Pub. Date: Dec. 30, 2021

(65) Prior Publication Data
US 2023/0332892 A1     Oct. 19, 2023

(30) Foreign Application Priority Data

Jun. 23, 2020   (FR) ...................................... 2006563

(51) Int. Cl.
*G01C 19/64*     (2006.01)
*G21K 1/00*      (2006.01)
(Continued)

(52) U.S. Cl.
CPC ............. *G01C 19/64* (2013.01); *G21K 1/006* (2013.01); *H03L 7/26* (2013.01); *H05H 3/00* (2013.01)

(58) Field of Classification Search
CPC .......... G01C 19/64; G21K 1/006; H03L 7/26; H05H 3/00
See application file for complete search history.

(56) References Cited

U.S. PATENT DOCUMENTS

| 2018/0352642 | A1* | 12/2018 | Dupont-Nivet | ........ | G01C 19/64 |
| 2022/0397396 | A1* | 12/2022 | Wirtschafter | .......... | G01C 19/64 |
| 2022/0397397 | A1* | 12/2022 | Wirtschafter | .......... | G01C 19/64 |
| 2023/0178262 | A1* | 6/2023 | Dupont-Nivet | ........ | G01C 19/64 |
| | | | | | 250/251 |

(Continued)

FOREIGN PATENT DOCUMENTS

WO     2017/089489 A1     6/2017

OTHER PUBLICATIONS

Krasnok, et al., "Antenna model of the Purcell effect", Nature—Scientific Report, vol. 5, No. 1, Aug. 2015.
(Continued)

*Primary Examiner* — Jonathan M Hansen
(74) *Attorney, Agent, or Firm* — Maier & Maier, PLLC

(57) ABSTRACT

A device for measuring a quantity representative of a population (N) of cold atoms, the cold atoms being located in a cloud of cold atoms to be analyzed, the device includes a microwave source configured to generate an incident signal at a predetermined signal frequency, a microwave guide configured to propagate the incident signal and an antenna configured to emit the incident signal to the cloud of cold atoms and its environment, the antenna and the microwave guide also being able to recover an atomic reflected signal resulting from a reflection of the incident signal by the cloud and its environment, and which propagates in the
(Continued)

waveguide in the opposite direction to the incident signal, a splitting device coupled to the microwave guide and configured to extract at least part of the atomic reflected signal, a detector configured to detect the atomic reflected signal extracted by the splitting device, the quantity representative of the population of cold atoms (N) being obtained from a detected value of the atomic reflected signal and from a detected value of a signal reflected by the environment in the absence of the cloud, called reference reflected signal.

13 Claims, 14 Drawing Sheets

(51) Int. Cl.
  *H03L 7/26*    (2006.01)
  *H05H 3/00*    (2006.01)

(56) References Cited

U.S. PATENT DOCUMENTS

| 2024/0134084 A1* | 4/2024 | Bongs | G01V 7/00 |
| 2024/0426865 A1* | 12/2024 | Dupont-Nivet | G01C 19/60 |
| 2025/0044091 A1* | 2/2025 | Wirtschafter | G01P 15/08 |
| 2025/0044092 A1* | 2/2025 | Wirtschafter | G01C 19/58 |

OTHER PUBLICATIONS

Meyer, et al., "Dynamical low-noise microwave source for cold atom experiments", arXiv, Cornell University, 2020.

Keil, et al., "Fifteen Years of Cold Matter on the Atom Chip: Promise, Realizations, and Prospects", arXiv, Cornell University, 2016.

Cronin, et al., "Atom Interferometers", arXiv, Cornell University, 2007.

* cited by examiner

DEVICE FOR MEASURING A QUANTITY REPRESENTATIVE OF A POPULATION OF COLD ATOMS AND ASSOCIATED SENSOR

CROSS-REFERENCE TO RELATED APPLICATIONS

This application is a National Stage of International patent application PCT/EP2021/066708, filed on Jun. 18, 2021, which claims priority to foreign French patent application No. FR 2006563, filed on Jun. 23, 2020, the disclosures of which are incorporated by reference in their entirety.

FIELD OF THE INVENTION

The present invention relates to the field of sensors based on clouds of cold atoms and more particularly to a device for implementing the step of detecting a number of atoms in a predetermined atomic state, leading to the measurement of the desired quantity.

BACKGROUND

Cold-atom sensors have already demonstrated excellent performance in terms of measuring time (clock), gravitational fields (gravimeter), accelerations (accelerometer), rotations (gyrometer) and magnetic field (magnetometers). They may also be used in the field of spectroscopy.

To carry out the measurement, a cold-atom sensor requires obtaining a cloud of cold atoms, that is to say atoms that have been slowed down in the three directions in space, in a vacuum chamber. The temperature of the atoms in the cloud is typically less than 10 μK. They are prepared in a given hyperfine state.

For the implementation of the sensor, a distinction is drawn between:
- a step of preparing the atoms, consisting in producing the abovementioned cloud,
- an actual interferometric measurement step (clock, acceleration, rotation) based on the cloud. One generation of cold-atom sensors uses an atom microcircuit or atom chip, which comprises microwires for guiding/trapping the one or more clouds of cold atoms close to its surface.
- a detection step, consisting in converting the interferometric phase accumulated by the atomic wave function during the measurement into a population difference between two Zeeman sub-levels (hyperfine levels), and then in measuring this population difference and, finally, in deducing the desired physical quantity from this population difference. According to the prior art, this reading is carried out using a detection laser that illuminates the cloud of cold atoms.

The atoms to be detected are those that are cooled and then manipulated on the microcircuits of the atom chip. First prepared in a given hyperfine fundamental state, they are guided or trapped on the microcircuit at a distance h of between 3 and around one hundred μm, and so as to produce an atom interferometer for measuring an inertial quantity.

One example of an atom chip Ach0 for an accelerometer/gyrometer inertial sensor is illustrated in FIG. 1. An atom interferometer for measuring this inertial quantity is produced here. Part of the surface of the chip forms the measuring plane 13. FIG. 1 illustrates a cross section of a magnetic guide G generated by a microcircuit MC. The microcircuit is for example a magnetic quadrupole (created by a set of three wires or even by 5 wires or more), a set of coplanar microwave guides and conductive wires, etc. Generally speaking, the microcircuit is appropriately supplied with power, for example by voltage generators and/or DC and/or AC (RF) generators external to the atom chip or by an external magnetic field.

In the magnetic guide G, two clouds of atoms CL1 and CL2 are guided so as to propagate in opposite directions along a path 16. The magnetic guide G is generated by the wires of the chip (for example a magnetic guide quadrupole) so as to guide the two clouds of cold atoms, at a predetermined distance h from the measuring plane 13. The guide G is circular for a gyrometer and linear for an accelerometer. For an exclusively clock measurement, the cloud is not moved. The rotational velocity $\Omega$ is measured by the gyrometer about an axis Z normal to the measuring plane 13 of the chip 1. The acceleration is measured in the direction of the linear magnetic guide, along its axis (Y in FIG. 1).

The phase shift $\delta$ induced by the Sagnac effect between two counter-rotating matter waves in a reference frame rotating at the angular velocity $\Omega$ is given by:

$$\theta = 2Am/\hbar \cdot \Omega \tag{1}$$

where A is the area inscribed in the path, m is the mass of the atoms and $\hbar$ is the reduced Planck constant.

The phase shift $\Phi$ in the acceleration measurement is given by:

$$\Phi = 2kaT^2 \tag{2}$$

where k is the wave vector of the laser used to split (launch), deflect and recombine the clouds of atoms, 2T is the duration of the interferometer and a is the acceleration to be measured.

For an acceleration measurement, the path of the two clouds is one-dimensional, for a rotation measurement, the path is two-dimensional, and for a clock measurement, the cloud is not moved.

For example, the cloud CL1 comprises cold atoms in the state |a> with a velocity v1=+v and the cloud CL2 comprises cold atoms in the state |b> with a velocity v2=-v. For example, in the case of rubidium 87, the atomic levels |a> and |b> are spaced apart in terms of velocity by 4 $\hbar$k/M, but they correspond to the same internal state |F=2, mF=+2> (see further below).

When the two clouds have taken the closed path at least once, or a round trip for the linear case, they are recombined at the starting point (phase conversion) and then form the two clouds to be analyzed.

In the sensor, the atom chip 1 is placed in a vacuum chamber kept under vacuum for example using an ion pump and preferably comprising magnetic shielding.

The vacuum chamber also comprises a cold-atom source, comprising:

An atom source (dispenser), for example formed by a heating filament delivering a rubidium vapor, A (magneto-optical) primary atom trap, for pre-cooling and placing an initial cloud of cold atoms near the chip (preparation step).

The vacuum chamber also comprises a magnetic-field source GM, external to the chip Ach0. This makes it possible to impose a homogeneous and stationary magnetic field B0 over a thickness at least of the order of a height h above the measuring plane 13. Advantageously, the direction of the homogeneous magnetic field is parallel to the measuring plane.

The atoms used in cold-atom sensors are such that they have two fundamental atomic levels, said to be "hyperfine", that is to say separated in terms of frequency by a quantity $f_H$ of the order of gigahertz, which is highly stable and very well known. These atoms are typically rubidium 87, for which $f_H$=6.834 GHz, but other alkaline atoms such as rubidium 85 ($f_H$=3.0 GHz), cesium ($f_H$=9.2 GHz), sodium ($f_H$=1.7 GHz) or potassium 40 ($f_H$=1.3 GHz) or rare-earth ions such as ytterbium ($f_H$=12.6 GHz) have the same type of atomic structure and may be used. When the two fundamental atomic levels are subjected to a homogeneous magnetic field B0, they break down into Zeeman sub-levels, each separated by a frequency f0 dependent on the applied magnetic field (typically a few hundred kHz per gauss). This bias field, as it is known, is useful for the operation of the sensor.

For rubidium, the lowest hyperfine level is called F=1 and the highest level is called F=2, and FIG. 2 illustrates the various associated Zeeman sub-levels, identified by a value of a quantity mF. For F=1, $m_F$ may adopt the values −1, 0, +1 and, for F=2, $m_F$ may adopt the values −2, −1, 0, +1, +2. An atomic state is identified according to the value of F and that of $m_F$, for example |F=1, $m_F$=−1>.

FIG. 2 also illustrates three known atomic transitions Tn, Tm and Tn (called σ+) of rubidium 87 that are used for the operation of the inertial sensor, and there is:

Transition Tn between |F=2, $m_F$=+2> and |F=1, $m_F$=+1>, of frequency $f_T$=$f_H$+3f0

Transition Tm between |F=2, $m_F$=+1> and |F=1, $m_F$=0>, of frequency $f_T$=$f_H$+f0

Transition Tl between |F=2, $m_F$=0> and |F=1, $m_F$=−1>, of frequency $f_T$=$f_H$−f0

During operation of the sensor in FIG. 1, the starting state of the atoms is one of the Zeeman sub-levels (for example |F=2, $m_F$=+2>) with a velocity of zero. It is chosen based on the sensor and the desired measurement type.

Using a laser that produces a Bragg transition, the velocity of the atoms in the starting state is modified so as to create a state |a> with a velocity v1=+v and a state |b> with a velocity v2=−v. The internal state is thus still the same Zeeman sub-level, but there are now two states |a> and |b> that are differentiated in terms of velocity.

The method for measuring a given physical quantity (clock, acceleration, rotation, magnetic field) by way of an atom-chip sensor comprises several of the abovementioned steps (preparation, measurement, detection). More specifically, the various steps implemented by a cold-atom sensor as illustrated in FIG. 1 are detailed below and illustrated in FIG. 3.

The preparation step E1 consists in generating a cloud of cold atoms, including the emission of said atoms by a source, the cooling of said atoms, the initialization of said atoms in at least one atomic state for guiding the cloud, for example |F=2, $m_F$=+2>, in a magnetic potential minimum.

The measuring step comprises one (E2) or two (E2 and E3) sub-steps:

In a step E2, the atomic states are initialized through coherent superposition of the cold atoms between the first atomic state |a> of velocity v1 and a second atomic state |b> of velocity v2.

|a>=|F=2,$m_F$=+2; v1=+v>; |b>=|F=2,$m_F$=+2; v2=−v>.

This initialization is carried out by a first pulse, called "π/2", which prepares 50% of the atoms in the state |a> and the other 50% of the atoms in the state |b>. Following this pulse, two clouds CL1 and CL2 are produced, comprising atoms respectively in the states |a> and |b> and of opposite velocities, and which split spatially along a predefined path.

In a step E3, the velocities of the atoms are exchanged with a second pulse, called "π", so as to make them return to the starting point. The state |a> then has a velocity −v and the state |b> has a velocity +v. For the case of a circular guide G, only their arrival at the starting point is expected, the time of arrival being fixed by the radius of the circular guide and the velocity v.

The detection step also comprises multiple sub-steps.

Once each cloud has returned to the starting point, in a step E4, the two atomic velocity states are recombined so as to mix the two propagation states with a third "π/2" pulse. After the recombination, the two clouds CL1 and CL2, which are in free propagation mode, split again, and then form the two clouds to be analyzed.

Generally speaking, after a "π/2" pulse (split or recombination pulse):

1) the cloud CL1 always has a velocity v1 and contains N1 atoms.
2) the cloud CL2 always has a velocity v2 and contains N2 atoms.

Then, after the last "π/2" pulse, in the recombination:

1) the cloud CL1 contains N1 atoms of which p % of the atoms were in the cloud CL1 before this pulse and (100−p) % of the atoms were in the cloud CL2 before this pulse.
2) the cloud CL2 contains N2 atoms of which (100−p) % of the atoms were in the cloud CL1 before this pulse and p % of the atoms were in the cloud CL2 before this pulse.

In other words, at the end of the measurement performed by the interferometer, the number of atoms having the velocity v1 and the number of atoms having the velocity v2 are counted independently of their origin, cloud CL1 or CL2, before the last "π/2" pulse.

In other types of sensors, such as the gyrometer described in document WO 2017089489, during the recombination and after this, the atom cloud is trapped (it is also said to be parked) in its initial position, and the two clouds to be analyzed are then coincident, and there is only one cloud of cold atoms to be analyzed. The microcircuit consists here of two coplanar microwave guides and conductive wires carrying a DC current, which move the two clouds on a rectangular path.

During this recombination, the phase accumulated by the atomic wave function during the measurement is transferred into a population difference between the two Zeeman sub-levels |a> and |b>. Let N1 be the population of atoms in the state |a> and N2 be the population of atoms in the state |b> after the phase transfer. The two probabilities Prob1 and Prob2 of the atoms respectively occupying the two atomic levels |a> and |b> are then expressed using the formulas:

$$Prob_1 = \frac{N_1}{N_1 + N_2} = \frac{1}{2}[1 + \cos(\varphi + \varphi_0)] \quad (3)$$

$$Prob_2 = \frac{N_2}{N_1 + N_2} = \frac{1}{2}[1 - \cos(\varphi + \varphi_0)] \quad (4)$$

Where φ is the desired phase and $\varphi_0$ is the phase that defines the working/operating point of the sensor.

In a step E5', the number of atoms (population) N1 in the state |a> for the cloud CL1 and N2 in the state |b> for the cloud CL2 is measured, which make it possible to calculate the probabilities Prob1 and Prob2. These are the ratio between the number of atoms in the states |a> and |b>, respectively, and the total number of atoms participating in the measurement. Next, the phase is determined from Prob1 and Prob2.

Finally, in a step E6, the desired physical quantity is determined from the phase.

According to the prior art, step E5', that is to say the detection of a signal at the output of an atom interferometer, is carried out using a detection laser that illuminates the cloud of cold atoms to be analyzed, called CL here. Two methods are used.

A first method, illustrated in FIG. 4, consists in illuminating the cloud to be analyzed with a resonant laser beam FL (excitation via an optical transition) and imaging the cloud on a detector. Each level absorbs radiation differently, and an image is obtained through absorption of the cloud by detecting, on a CCD camera, the transmission of the laser beam FL passing through the atoms. This then gives the number of atoms in each level.

In a second method, illustrated in FIG. 5, the atom cloud is subjected to resonant laser excitation by illuminating it with a beam FL' (excitation via an optical transition) and a fluorescence signal emitted by the cloud, dependent on the number of atoms in the atomic level that fluoresces, is collected on a photodiode D0.

In both cases, the atoms are excited for example in the state |a> at an optical level very far from the levels |a> and |b> (several THz away), and the number of atoms in the state |a> is then measured, causing them to disappear. The same applies to the state |b>. The respective population of each level is therefore measured using this optical level (typically 780 nm).

These two methods exhibit a major drawback: they are destructive. This means that, to restart a measurement cycle, a new cloud of cold atoms has to be prepared. This leads to dead times in the measurement of the physical quantity. These dead times limit the stability of the sensor (Dick effect) and limit the bandwidth of the sensor (typically 1 Hz).

Moreover, these two methods require complex and very bulky optical systems to effectively detect the atoms. They are incompatible with the development of compact inertial sensors with low power consumption.

One aim of the present invention is to rectify the above-mentioned drawbacks by proposing a method for measuring a quantity representative of the population of atoms in a predetermined atomic state, the atoms being located in a cloud of cold atoms, the measurement being non-destructive and non-optical.

SUMMARY OF THE INVENTION

The present invention relates to a device for measuring a quantity representative of a population of cold atoms occupying a predetermined atomic level, said cold atoms being located in a cloud of cold atoms to be analyzed, the device comprising:
- a microwave source configured to generate an incident signal at a predetermined signal frequency,
- a microwave guide configured to propagate said incident signal and an antenna configured to emit said incident signal to said cloud of cold atoms and its environment, said antenna and said microwave guide also being able to recover an atomic reflected signal resulting from a reflection of the incident signal by said cloud and its environment, and which propagates in the waveguide in the opposite direction to the incident signal,
- a splitting device coupled to the microwave guide and configured to extract at least part of the atomic reflected signal,
- a detector configured to detect said atomic reflected signal extracted by the splitting device,
- said quantity representative of the population of cold atoms of said predetermined atomic level being obtained from a detected value of the atomic reflected signal and from a detected value of a signal reflected by the environment in the absence of said cloud, called reference reflected signal.

According to one embodiment, said representative quantity is proportional to said population.

According to one embodiment, said representative quantity is called atomic reflection coefficient and defined as follows:

$$\Gamma_A = \frac{S_A - S_0}{S_A + S_0}$$

where $S_A$ is the detected value of the atomic reflected signal and $S_0$ is the detected value of the reference reflected signal.

According to one variant, the detector is configured to detect atomic and reference reflected powers, said representative quantity being determined from said atomic and reference powers.

According to another variant, the detector is configured to detect atomic and reference reflected amplitudes, said associated representative quantity being determined from said amplitudes, and/or to detect atomic and reference phases, said associated representative quantity being determined from said phases.

Preferably, the splitting device is configured to extract a fraction of the incident signal and the detector is configured to detect said fraction of the incident signal and to measure said atomic and reference phases.

Preferably, the microwave guide and the antenna are integrated on an atom chip.

According to one embodiment, the signal frequency fs is such that:

$$fs \geq fT + f0/2$$

where fT is the frequency of the highest detection transition among the possible transitions and f0 is the separation frequency of two Zeeman sub-levels of said cold atoms.

According to another aspect, the invention relates to a cold-atom sensor comprising:
- an atom chip comprising a microcircuit configured to generate a magnetic guide and an atom source, the atom chip and the atom source being placed in a vacuum chamber,
- the sensor being configured to generate an initial cloud of cold atoms comprising atoms having a first atomic level and a second atomic level, to generate and where applicable move, in the opposite direction along a predetermined path, a cloud of cold atoms having said first atomic level and a cloud of cold atoms having said second atomic level, and to recombine said clouds of cold atoms, so as to generate at least one cloud of cold atoms to be analyzed,
- the cold-atom sensor furthermore comprising:
- at least one measuring device according to the invention configured to measure a first quantity representative of the population of the first atomic level and a second quantity representative of the population of the second atomic level, a physical quantity being determined from said first and second representative quantities.

Preferably, the microwave guide and said antenna of the measuring device are integrated on said atom chip and said antenna is located close to a position of the cloud of cold atoms to be analyzed.

According to one embodiment, the splitting device of the measuring device is also integrated on said atom chip.

According to one embodiment, the sensor according to the invention is configured to generate a first and a second cloud of cold atoms to be analyzed in motion, and comprising a first and a second measuring device comprising, respectively, a first and a second waveguide and a first and a second antenna integrated on said chip, the first measuring device being configured to measure the first quantity representative of the first cloud and the second measuring device being configured to measure the second quantity representative of the second cloud.

According to yet another aspect, the invention relates to a method for measuring a quantity representative of a population of cold atoms occupying a predetermined atomic level, said cold atoms being located in a cloud of cold atoms to be analyzed, the method comprising the steps of:
A generating a microwave incident signal at a predetermined signal frequency,
B propagating, in a microwave guide, and, where applicable, emitting said incident signal to said cloud of cold atoms,
C recovering a reflected signal resulting from the reflection of the incident signal from said cloud and its environment, called atomic reflected signal, and which propagates in the waveguide in the opposite direction to the incident signal,
D extracting at least part of the atomic reflected signal,
E detecting said extracted atomic reflected signal,
F before or after steps A to E performed in the presence of the cloud of cold atoms, performing steps A to E in the absence of said cloud, the reflected signal, called reference reflected signal, then resulting from the reflection of the incident signal by the environment in which the cloud evolves, but in the absence of said cloud,
G determining said quantity representative of the population of cold atoms of the atomic level to be analyzed from a value of the atomic reflected signal and from a value of the reference reflected signal.

The following description presents several exemplary embodiments of the device of the invention: these examples do not limit the scope of the invention. These exemplary embodiments present both the essential features of the invention and additional features related to the embodiments under consideration.

BRIEF DESCRIPTION OF THE DRAWINGS

The invention will be better understood and other features, aims and advantages thereof will become apparent during the following detailed description and with reference to the appended drawings, which are given by way of non-limiting examples and in which.

DETAILED DESCRIPTION

Figure 6:
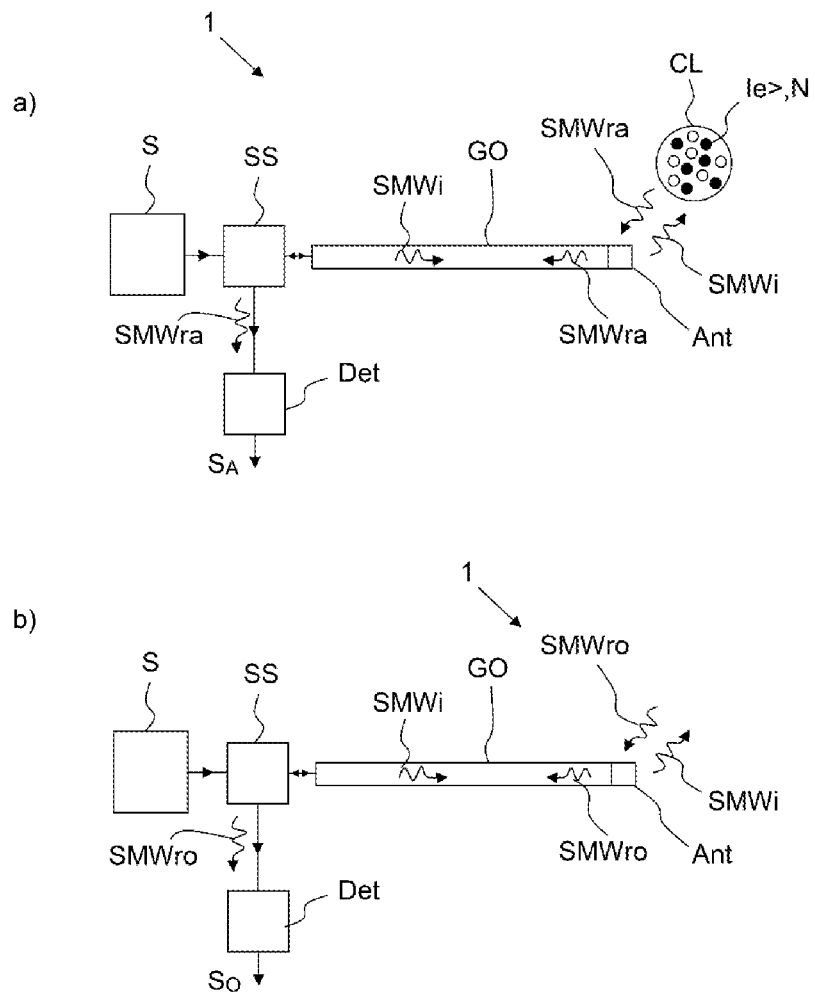
FIG. 6 illustrates a device for measuring a quantity representative of the population of cold atoms according to the invention.

The device 1 for measuring a quantity representative of the population N of cold atoms occupying a predetermined atomic level, called |e>, and located in a cloud CL of cold atoms to be analyzed, is illustrated in FIG. 6. The device 1 comprises a microwave source S configured to generate an incident signal SMWi at a predetermined signal frequency fs, a microwave guide GO coupled to the source S and configured to propagate the incident microwave (MW) signal and an antenna Ant configured to emit the incident signal to the cloud of cold atoms CL to be analyzed. According to one preferred embodiment, it is the end of the guide GO that acts as antenna (shape of the end of the guide, way of connecting the wires to this end). According to another embodiment, the antenna Ant is an additional component coupled to the microwave guide GO. The term antenna thus refers either to the emitting part of the guide GO or to the additional component playing this role, referred to as such when it exists.

The antenna Ant and the microwave guide GO are also able to recover an atomic reflected signal SMWra resulting from a reflection of the incident signal by said cloud and its environment, and which propagates in the waveguide in the opposite direction to the incident signal. This reflected signal results from the modification of the radiation impedance caused by the presence of the atom cloud. Indeed, the microwave power emitted by the antenna depends on the medium into which said antenna radiates. This dependence is defined by the radiation impedance of the medium and is specific thereto. All of the microwave power of the incident signal SMWi sent to the antenna from the source S is thus not absorbed by the medium around the antenna. Part of the sent power is reflected and carried by the atomic reflected signal SMWra. This signal SWMra contains information about the medium into which said antenna radiates, and the inventors have demonstrated and validated that, in particular, this information includes a quantity representative of the number of atoms and the atomic state they are in.

The origin of the radiation impedance, and therefore of the atomic reflected signal, is explained as follows. Atoms are characterized by a magnetic dipole moment and, in a highly simplified manner, they may be considered as magnets that interact with the magnetic component of the microwave field. This interaction depends on the internal state of the atoms. In the case of rubidium 87 atoms, it is the Zeeman magnetic states of the fundamental hyperfine states that are able to be coupled with the field. The microwave magnetic field of signal frequency fs thus excites the magnetic dipole of a determined atomic transition T of the material making up the atoms, for example rubidium 87, with an efficiency that depends, inter alia, on the difference between the signal frequency fs and the frequency of the transition. This atomic magnetic dipole in turn emits a microwave field that, once picked up by the antenna, generates the atomic reflected signal SMWra. The incident signal SMWi and reflected signal SMWra are superposed in the waveguide GO and give rise to a reflection coefficient that quantifies the radiation impedance of the antenna in the presence of the atoms. The physical origin of radiation impedance is discussed in the publication "An antenna model for the Purcell effect" by Alexander E. Krasnok et al, Nature—Scientific Report, August 2015.

In other words, in the presence of atoms, the impedance seen by the microwave generator S is defined by the coupling between the magnetic component of the field and the magnetic moment of the atoms. This coupling is dependent on the total number of atoms, on their internal state, on the mismatch between the signal frequency (atom interrogation frequency) with respect to the atomic transitions between hyperfine states, the velocity of the atoms and the power radiated by the antenna.

To access this reflected signal, the device according to the invention also comprises a splitting device SS coupled to the microwave guide GO and configured to extract at least part of the reflected signal, and a detector Det configured to detect the reflected signal extracted by the splitting device.

In addition to the atomic reflected signal in the presence of the atom cloud SMWa, the signal reflected by the environment in the absence of said cloud CL is also detected in the same way, and this signal is called reference reflected signal SMWr0. The inventors have demonstrated that a quantity representative of the population of cold atoms N of said predetermined atomic level is obtained from a detected value $P_A$ of the atomic reflected signal and from a detected value $P_0$ of the reference reflected signal. The population N of atoms is thus related to the radiation impedances with and without the presence of the atoms.

For optimum operation of the device, the atoms in the cloud are placed in the nearfield of the antenna, at a distance that allows observation of the reflected signal with a good signal-to-noise ratio defined by the application under consideration. This distance is typically between a few microns and 500 μm.

The device according to the invention has numerous advantages over the existing optical devices described above.

It makes it possible to directly obtain an electrical signal representative of the number of atoms in the predetermined atomic state.

The device according to the invention may be used in different ways depending on the application.

For an application of the device according to the invention in spectroscopy, directly obtaining a quantity representative of the number of atoms on a given level, as a function of the signal frequency fs, makes it possible, by varying this interrogation frequency, to locate the frequencies of the transitions more easily (see further below).

For an application of the device in inertial sensors and, more generally, in atomic interferometers, the production of these systems is made easier by the integration of a device 1 according to the invention.

The detection is non-destructive, making it possible to carry out multiple measurements, for example inertial measurements, with the same cloud of atoms. The contribution of preparation time (cooling) to the dead time of the interferometer may thus be reduced/removed over a duration equivalent to the lifetime of the cold-atom samples. As explained above, the existence of dead times limits the stability of the inertial sensor. With non-destructive measurements, this limit is pushed back, making it possible for example to achieve autonomous inertial navigation over relatively long durations.

As a result of their intrinsic nature, the cold-atom inertial sensors from the prior art have a limited bandwidth, typically limited to 1 Hz, due to the cooling of the atoms. The possibility of carrying out multiple non-destructive measurements in a row, on one and the same cold-atom sample, made possible by the measuring device according to the invention, increases the bandwidth of the sensor.

The device according to the invention is particularly suitable for a system using an atom chip (such as inertial chip sensors, one example of which is described above) in which the atoms to be detected are those that are cooled and then manipulated on the microcircuits of the atom chip. In this embodiment, the microwave guide GO and the antenna Ant of the device according to the invention are integrated on the atom chip.

As explained above, the cold atoms are first prepared in a given hyperfine fundamental state, and are then guided or trapped on the microcircuit at a distance h and so as to produce an atom interferometer for measuring an inertial quantity. The waveguide GO here is preferably a coplanar microwave waveguide microfabricated on the chip. The guide is formed by a minimum of three microwires separated from one another by a given distance d. The microwires may follow a straight or curved line or any other pattern required for the intended application. For the case of the minimum three-wire configuration, the two wires on the outside are connected to the ground of the microwave source and the central wire carries the active signal.

However, it is also possible to use other types of waveguide, in particular waveguides whose fabrication is compatible with deposition-based or etching-based microfabrication techniques, such as a microstrip line.

The fabrication process for the waveguide GO is essentially the same as the one used to fabricate the microcircuit MC, thereby simplifying the fabrication of the sensor.

The guide GO is typically produced in a plane of the chip different from that of the microcircuit generating the magnetic guide G, thereby making it possible to bring the antenna as close as possible to the cloud, for example by locating the antenna (which may be the end of the guide GO) in line with the path of the clouds.

The detection carried out by a device according to the invention integrated on a chip makes it possible to considerably reduce the size of the inertial sensor. This then does away with complex and often relatively bulky optical systems for detecting the atoms effectively. This also does away with CCD cameras, the large size of which is defined by the electronics required for signal shaping (conversion of pixel intensity into a voltage). This drastic reduction in size in combination with simplification of fabrication opens up the way to industrial production of this type of sensor/interferometer.

The integrated nature of the measuring/detection device according to the invention allows good reproducibility from one device to another.

By modeling the interactions between the incident signal and the atom cloud, the inventors demonstrated that the number of atoms in the level under interrogation was a function of a representative quantity $\Gamma_A$ defined as follows:

$$\Gamma_A = \frac{S_A - S_0}{S_A + S_0} \quad (5)$$

where $S_A$ is the detected value of the atomic reflected signal and $S_0$ is the detected value of the reference reflected signal. This quantity $\Gamma_A$ is called atomic reflection coefficient.

According to a first embodiment, the detected signal is the microwave power P.

In this case, the coefficient $\Gamma_A$ is written $\Gamma_{AP}$, is real and is written:

$$\Gamma_{AP} = \frac{P_A - P_0}{P_A + P_0} \quad (6)$$

where $P_A$ is the atomic reflected power and $P_0$ is the reference reflected power.

The detector Det here is a microwave power detector.

According to a second embodiment, the detected signal is a voltage (amplitude and phase of the electrical signal). The waveguide GO propagates a microwave signal, and therefore the voltages $V_A$ and $V_0$ may be written as follows:

$$V_A = V_{A0} \cos(w\ t + \varphi_A) \text{ and}$$

$$V_0 = V_{00} \cos(w\ t + \varphi_0).$$

Where:

$V_{A0}$ is the atomic reflected amplitude, $V_{00}$ is the reference reflected amplitude, $\varphi_A$ is the relative phase between the incident signal and the atomic reflected signal, called atomic phase, and $\Phi 0_0$ is the relative phase between the incident signal and the reference reflected signal, called reference phase.

These voltages $V_A$ and $V_O$ may be represented by phase vectors (phasors).

$\Gamma_{AV}$ and $\Gamma_{A\varphi}$ are then defined as representative quantities respectively associated with the measurement of the amplitude and of the phase:

$$\Gamma_{AV} = \frac{V_{A0} - V_{00}}{V_{A0} + V_{00}} \quad (7)$$

$$\Gamma_{A\varphi} = \frac{\varphi_A - \varphi_0}{\varphi_A + \varphi_0} \quad (8)$$

The detector Det is configured here to detect the atomic and reference reflected amplitudes $V_{A0}$ and $V_{00}$, respectively, the associated representative quantity $\Gamma_{AV}$ being determined from said amplitudes $V_{A0}$ and $V_{00}$, and/or to detect the atomic and reference phases $\varphi_A$ and $\varphi_0$, respectively, the associated representative quantity $\Gamma_{A\varphi}$ being determined from said phases $\varphi_A$ and $\varphi_0$.

A detector Det for measuring the amplitude and the phase of the detected (atomic or reference) microwave signals is a vector network analyzer or a phase-amplitude detector (see further below).

Simultaneously measuring $\Gamma_{AV}$ and $\Gamma_{A\varphi}$ makes it possible to obtain two values of the characteristic quantity $\Gamma_A$, thereby improving the precision with which this quantity is determined.

Figure 7:
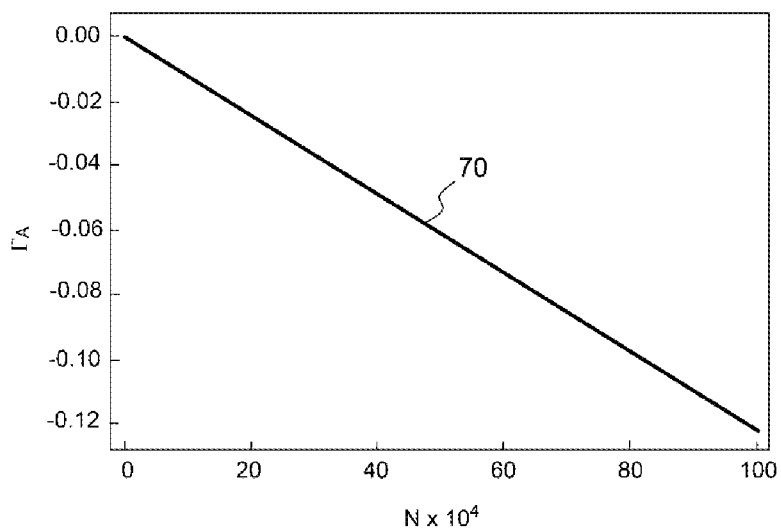
FIG. 7 illustrates the variation of the quantity $\Gamma_A$ representative of the population as a function of the population.

The inventors have also demonstrated that there is a first approximation of a proportionality relationship between the representative quantity $\Gamma_A$ defined in formula (6) (but also formulas (7) and (8), because the same quantity is involved, measured in three different ways) and the population N. The curve 70 in FIG. 7 describes one example of a variation of the value $\Gamma_A$ as a function of N. The following applies:

$$\Gamma_A = K \cdot N \quad (9)$$

where K is a proportionality factor.

The curve 70 is a theoretical curve calculated with power as detected quantity. The conditions of interest are: cloud size=1 mm; cloud temperature=2 µK; transition Tn |F=2, $m_F$=+2> to |F=1, $m_F$=+1>, signal frequency fs=0.999 $f_{Tn}$=0.999·($f_H$+3f0).

The proportionality factor K is a function of the chosen signal frequency fs, the atomic transition coupled by this signal frequency, the atomic species, the shape factor of the near field of the antenna (dependent on the chosen geometry of the antenna).

When it is desired to ascertain the exact value of the population N, this factor K may be determined, for a given device according to the invention, once and for all by way of calibration.

However, in many applications, the exact value of the population is not necessary, and the relevant information is extracted from the quantity representative of the population N, $\Gamma_A$.

Figure 8:
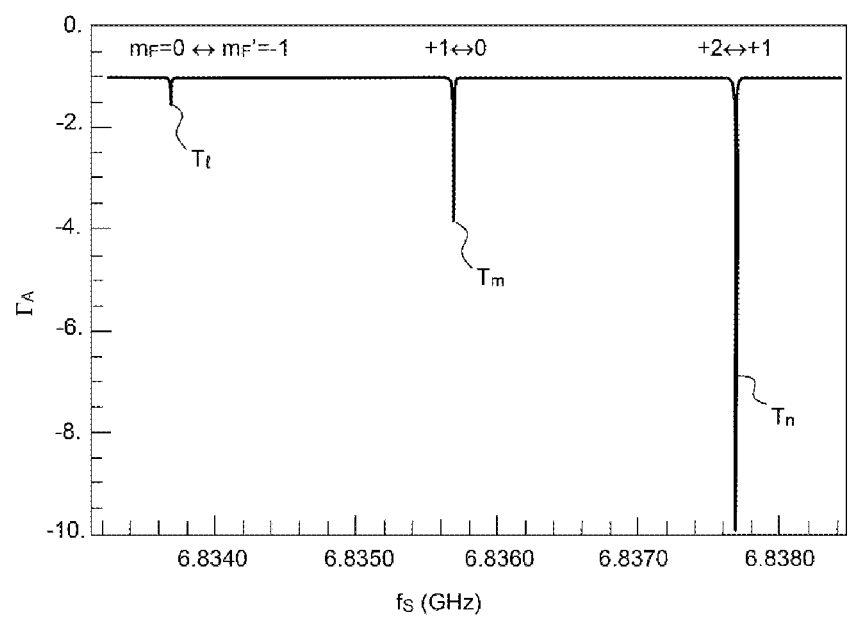
FIG. 8 illustrates a variation of the absolute value of the representative quantity $\Gamma_A$ obtained by interrogating a cloud of cold rubidium 87 atoms as a function of the interrogation frequency.

In spectroscopy, the relevant information may be deduced from the variation of $\Gamma_A$ as a function of the interrogation frequency fs. One exemplary variation of $\Gamma_A$ (defined by formula (6)) obtained by interrogating a cloud of cold rubidium 87 atoms over a set of interrogation frequencies fs is illustrated in FIG. 8 (curve 80). The coefficient $\Gamma_A$ is determined from the atomic and reference reflected powers measured by the detector Det. For this curve, the cloud comprises 104 atoms, and the distance from the cloud to the atom chip is h=5 µm.

It may be seen that the well-known transitions of rubidium 87, TI, Tm and Tn (see FIG. 2), appear clearly, and that their respective frequencies are identified.

For a value of the frequency fs equal to the frequency of a known transition, the value of $\Gamma_A$ is modified: there is indeed a sensitivity to the incident frequency of the atomic reflection coefficient $\Gamma_A$.

For an inertial sensor application, it is also not necessary to ascertain the exact value of the population. When it is necessary to analyze two clouds CL1 and CL2, a quantity $\Gamma_{A1}$ is determined for the population N1 of the atomic level |a> and a quantity $\Gamma_{A2}$ is determined for the population N2 of the atomic level |b>.

Two measuring devices according to the invention are preferably used for this (see further below). Since there is a proportionality factor K between N and $\Gamma_A$, in formulas (3) and (4) expressing the probabilities of occupancy, this is simplified between numerator and denominator, and prob1 and prob2 are deduced directly from $\Gamma_{A1}$ and $\Gamma_{A2}$:

$$Prob_1 = \frac{\Gamma_{A1}}{\Gamma_{A1} + \Gamma_{A2}} \quad (10)$$

$$Prob_2 = \frac{\Gamma_{A2}}{\Gamma_{A1} + \Gamma_{A2}} \quad (11)$$

When there are two clouds CL1 and CL2 to be analyzed in free propagation mode, the detection performed by the device according to the invention is preferably performed as a "time-of-flight" detection. The place and time of the recombination is not the place and time of the detection. The cloud to be analyzed moves, approaches the detector, passes in front (detection maximum) and moves away. The optimum time of detection is not easy to determine. In this case, the atomic and reference reflected signals are detected as a function of time over a determined time interval Δt covering, for the detection of the atomic reflected signal, the passage of the cloud of atoms close to the antenna. An integral of the atomic and reference signal is then measured.

When the recombination takes place on a trapped cloud that is no longer in motion (for example the sensor described in abovementioned document WO2017089489), the two representative quantities $\Gamma_{A1}$ and $\Gamma_{A2}$ may be measured with a single device according to the invention at two different times. The antenna Ant of the device should be positioned as close as possible to the position of the trapped cloud to be analyzed.

In the interferometer application and when $\Gamma_{AP}$ is measured, it is possible to choose the interrogation frequency fs in various ways depending on the purpose of the measurement.

When a measurement having a maximum signal-to-noise ratio is desired, the signal frequency fs is chosen so as to resonate with a given atomic transition (top of a peak in FIG. 8). The signal is then significant, but this configuration disturbs the populations N1 and N2 to the maximum extent, which will not allow the atoms to be reused for successive measurements.

When it is desired to reduce the destructiveness of the measurement, a frequency fs farther from resonance is chosen. Destructiveness of the measurement is understood to mean the change of Zeeman state of the atoms following the application of the detection signal at the frequency fs, that is to say the modification of the number of atoms N1 or N2 (interferometer application).

One benefit of measuring $\Gamma_{AV}$ and or $\Gamma_{A\varphi}$ rather than $\Gamma_{AP}$ is that of carrying out a measurement that is both relatively non-destructive and sensitive. To this end, the signal frequency is chosen so as to avoid resonance and to be located midway up a transition peak (FIG. 8). This configuration produces a good signal-to-noise ratio with minimum population disturbance.

The choice of the signal frequency fs at which the atom cloud CL to be analyzed is interrogated thus depends on the application and on the type of sensor under consideration.

For an application of the device according to the invention in spectroscopy, this frequency is scanned over a given range in order to identify the transitions (see FIG. 8).

For an inertial sensor application and when a measurement with low destructiveness is desired, in order to be able to reuse the atoms, the choice of the frequency fs depends on the atomic state to be measured |e> and on the permitted transitions (known as σ+), via the choice of a detection level |d> associated with |e>.

Figure 2:
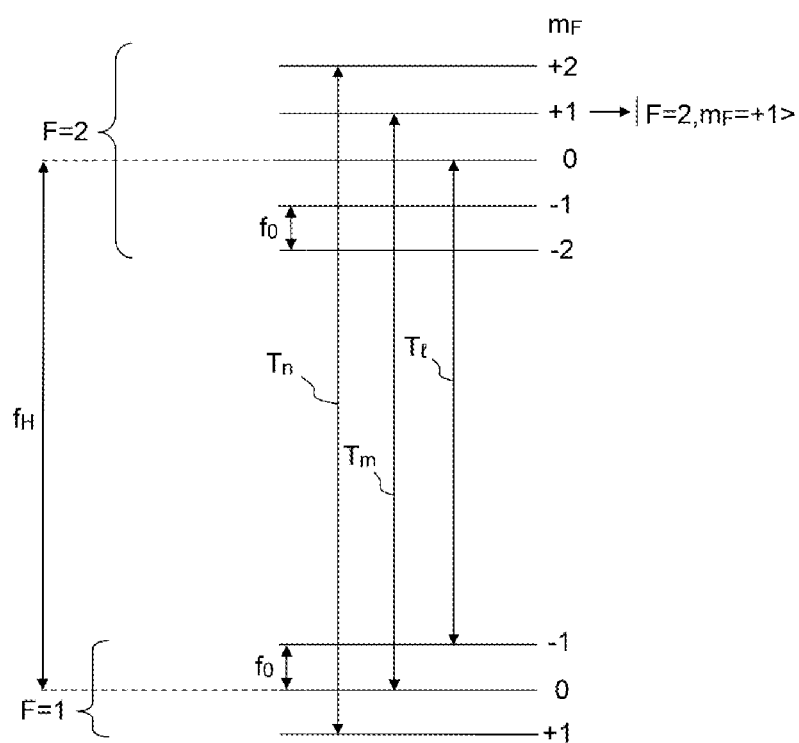
FIG. 2, already cited, illustrates the various Zeeman sub-levels of rubidium 87.
Figure 3:
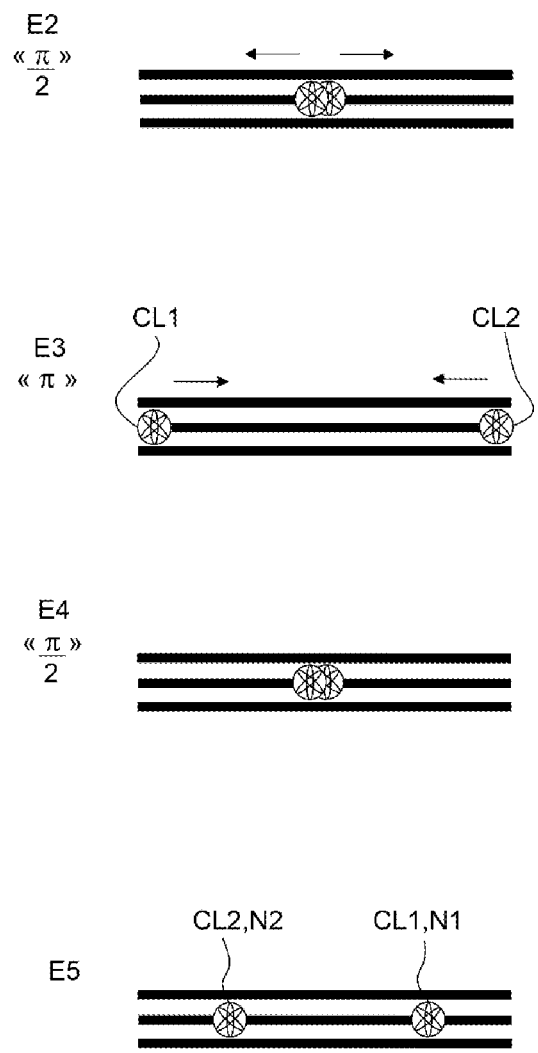
FIG. 3, already cited, illustrates the main steps implemented by a cold-atom sensor.
Figure 4:
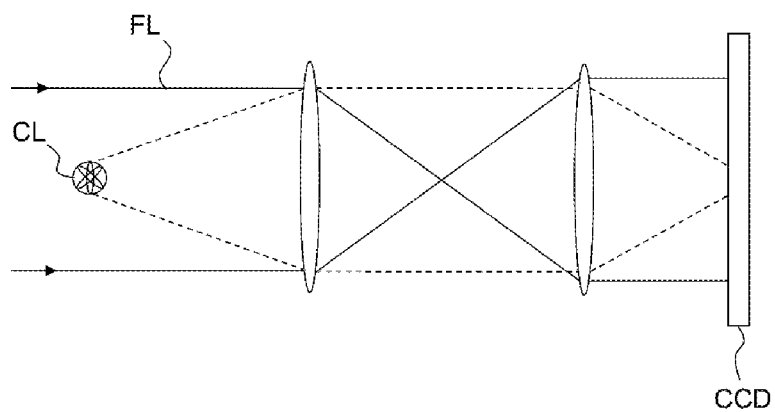
FIG. 4, already cited, illustrates a first optical detection method.
Figure 5:
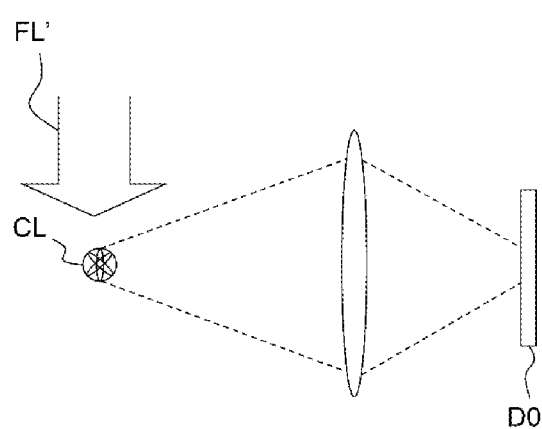
FIG. 5, already cited, illustrates a second optical detection method.

For example:

For |e>=|F=2, $m_F$=+2>, |d>=|F=1, $m_F$=+1> is chosen (transition Tn in FIG. 2).
For |e>=|F=2, $m_F$=+1>, |d>=|F=1, $m_F$=0> is chosen (transition Tm in FIG. 2).
For |e>=|F=2, $m_F$=0>, |d>=|F=1, $m_F$=−1> is chosen (transition Tl in FIG. 2).

As explained above, the frequency fs is not in this case equal to the frequency of the transition used for detection (resonance). The spacing is great enough, but not too great in order to keep a detectable reflected signal. It is necessary to find a compromise between destructiveness and sensitivity of the measurement. The frequency fs should in all cases be greater than the frequency of the highest detection transition among the possible transitions, called $f_T$, in order to avoid transferring atoms from one hyperfine state to another. It should satisfy the relationship:

$$fs \geq fT + f0/2 \quad (12)$$

where f0 is the separation frequency of two Zeeman sublevels of said cold atoms.

Figure 9:
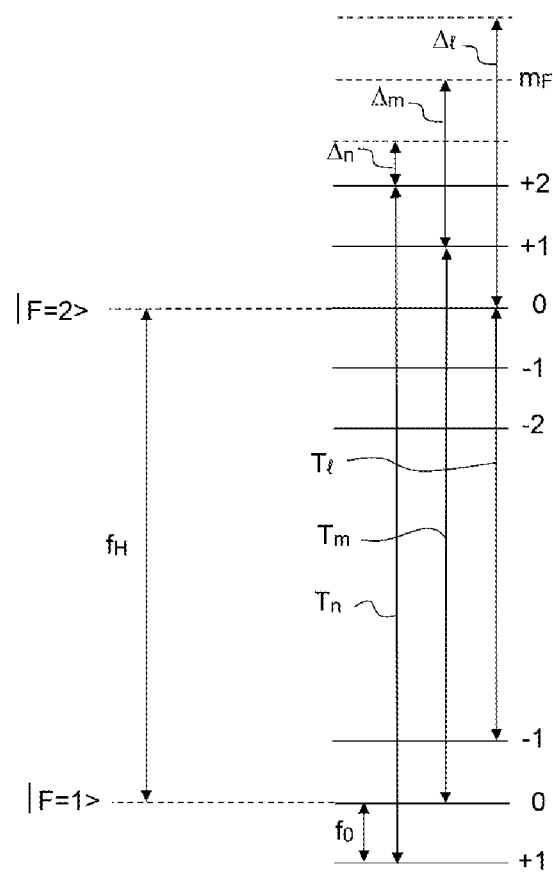
FIG. 9 describes the Zeeman levels of rubidium 87 and the frequency offset to be added to the detection transition in order to determine the signal frequency.

In order to comply with this relationship, FIG. 9 describes the frequency offset Δj to be added to the associated detection transition Tj to satisfy relationship (12).

For the transition Tn (measurement of |e>=|F=2, $m_F$=+2>), which is the highest transition, the gap Δn≥f0/2.

For the transition Tm, Δm≥2·f0+f0/2, For Tl, Δl≥4·f0+f0/2

The condition on the Δ thus depends on the chosen detection level |d>.

The frequency fs may be determined through a calibration step in which fs is varied, the resonant modifications of $\Gamma_A$ as a function of fs are observed and it is identified which interrogation frequency exhibits the best compromise as a function of the desired measurement performance. This calibration also makes it possible to characterize the destructiveness of the detection.

For an inertial sensor application, it is necessary to measure two quantities $\Gamma_{A1}$ and $\Gamma_{A2}$ representative, respectively, of N1 and N2, associated with the two atomic states |a> and |b> to be analyzed. For the example of the sensor in FIG. 1, the two states |a> and |b> to be analyzed (respectively populated with N1 and N2 atoms) are (see above):

|a>=|F=2,$m_F$=+2; v1=+v>; |b>=|F=2,$m_F$=+2; v2=−v>.

The states |a> and |b> are differentiated only in terms of velocity. The chosen detection state is therefore |d>=|F=1, $m_F$=+1> (transition Tn of frequency fn in FIG. 2) and the frequency fs=fn+f0/2. Discrimination takes place by velocity only, and therefore by the position of the atoms with respect to the antenna.

It may be seen that, in the device according to the invention, the interrogation for the detection is performed with microwave frequencies, unlike the prior art, which uses optical frequencies. This makes it possible to have the detector integrated directly on the atom chip and, in addition, to have an electrical signal corresponding to the populations of the atomic states of the interferometer.

Figure 10:
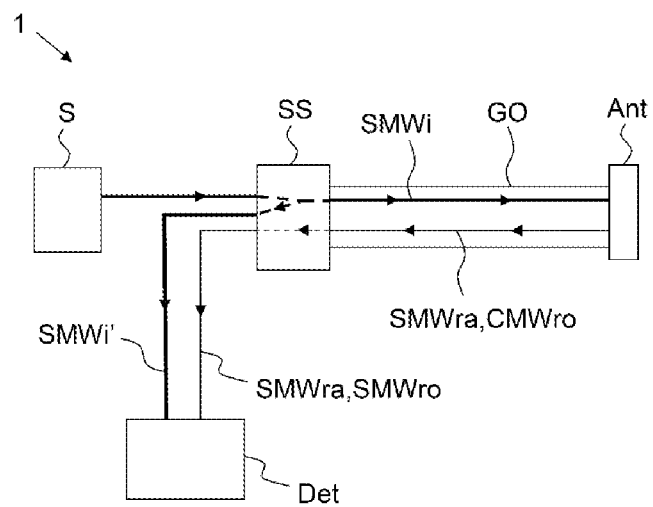
FIG. 10 illustrates a variant of the splitting device for extracting a fraction of the incident signal.

FIG. 10 illustrates a variant of the device 1 according to the invention for measuring the atomic and reference phases. For this purpose, the splitting device SS is configured to extract a fraction SMWi' of the incident signal and the detector Det is configured to detect the fraction of the incident signal and thus measure the phase between the incident signal and the atomic reflected signal (atomic phase $\varphi_A$), and the phase between the incident signal and the reference reflected signal (reference phase $\varphi_0$).

Figure 11:
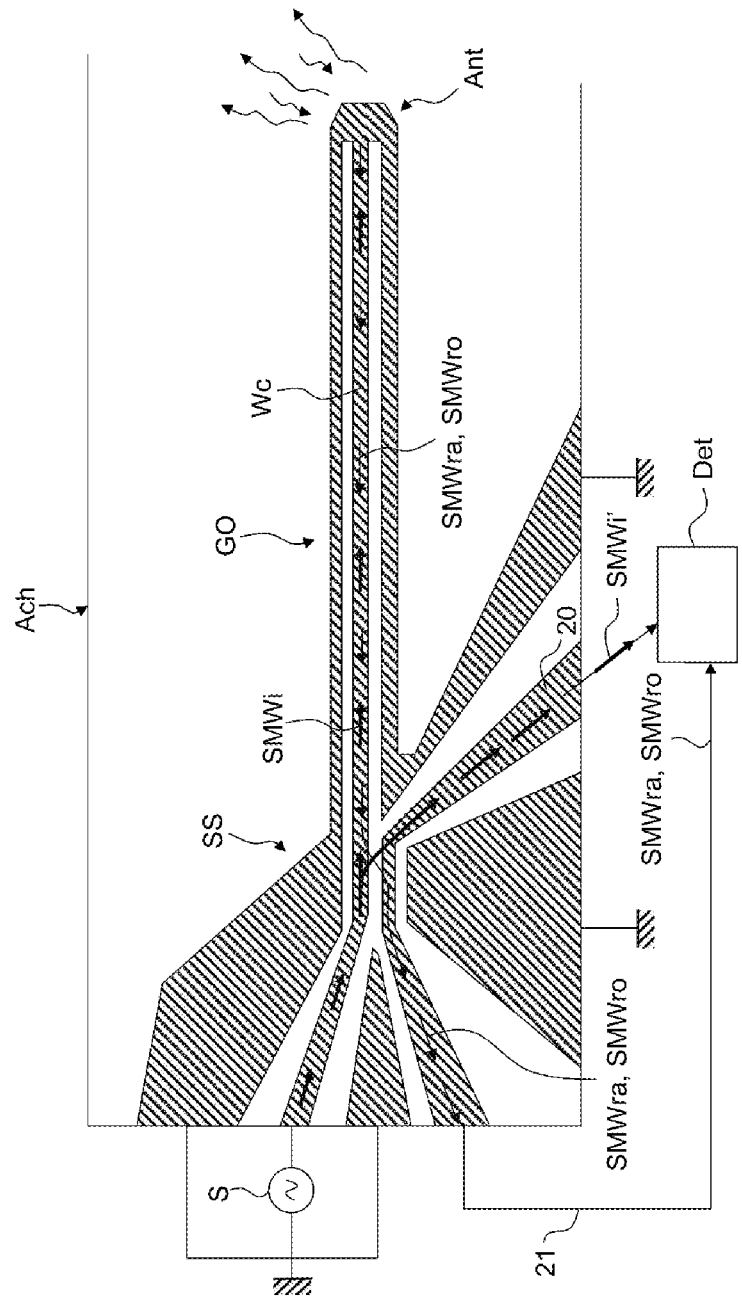
FIG. 11 illustrates one example of a splitting device integrated on the atom chip and coupled to a 3-wire coplanar microwave guide, which is also integrated.

One example of a splitting device SS integrated on the chip Ach and coupled to a 3-wire coplanar microwave guide that is also integrated, making it possible to measure the amplitude and the phase of the reflected signals, is illustrated in FIG. 11. The central wire WC carrying the incident signal and the reflected signal is coupled to a wire 20 configured, on the one hand, to collect the fraction SMWI' of the incident signal and direct it to the detector Det and, on the other hand, to direct the reflected signal to the detector via a link 21. This splitting device works as a bidirectional microwave coupler optimized around the frequency $f_H$ (very close to fs).

The detector Det here is a vector network analyzer or a phase-amplitude detector for measuring the amplitude and the phase between the incident signal and the (atomic or reference) reflected signal.

According to another aspect, the invention relates to a cold-atom sensor CAS integrating at least one measuring device according to the invention. This may be any type of sensor based on the use of a cloud of cold atoms containing information about the physical quantity to be measured encoded by a population of atoms in a determined atomic level, and which therefore requires a measurement of a quantity representative of this population.

According to one variant, the sensor CAS according to the invention comprises an atom chip Ach, and preferably the antenna Ant, the guide GO and the splitting device SS are integrated on the atom chip Ach.

Atom-chip inertial sensors have been described in the prior art.

The sensor CAS according to this variant of the invention comprises an atom chip Ach comprising a microcircuit configured to generate a magnetic guide G and an atom source AS, the atom chip and the atom source being placed in a vacuum chamber.

Figure 1:
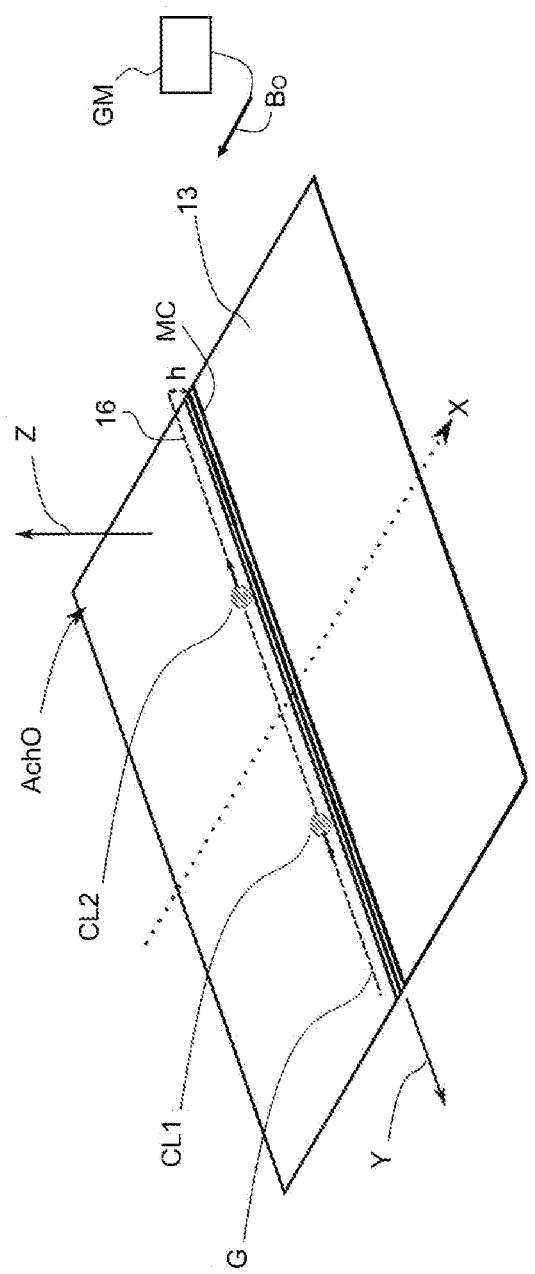
FIG. 1, already cited, illustrates an atom chip for an accelerometer/gyrometer inertial sensor.

The sensor is configured to generate an initial cloud of cold atoms comprising atoms having a first atomic level |a> and a second atomic level |b>, to generate and where applicable move, in the opposite direction along a predetermined path, a cloud of cold atoms having the first atomic level and a cloud of cold atoms having the second atomic level, and to recombine said clouds of cold atoms, so as to generate at least one cloud with cold atoms to be analyzed: a single trapped cloud CL for the sensor described in document WO 2017089489; two clouds CL1 and CL2 in free propagation mode for the sensor in FIG. 1.

The cold-atom sensor furthermore comprises at least one measuring device 1 according to the invention configured to measure a first quantity $\Gamma_{A1}$ representative of the population N1 of the first atomic level |a> and a second quantity $\Gamma_{A2}$ representative of the population N2 of the second atomic level |b>. A physical quantity, such as an inertial quantity, is determined from the first and second representative quantities $\Gamma_{A1}$ and $\Gamma_{A2}$. To this end, $\Gamma_{A1}$ and $\Gamma_{A2}$ are measured sequentially in time by the device 1.

Figure 12:
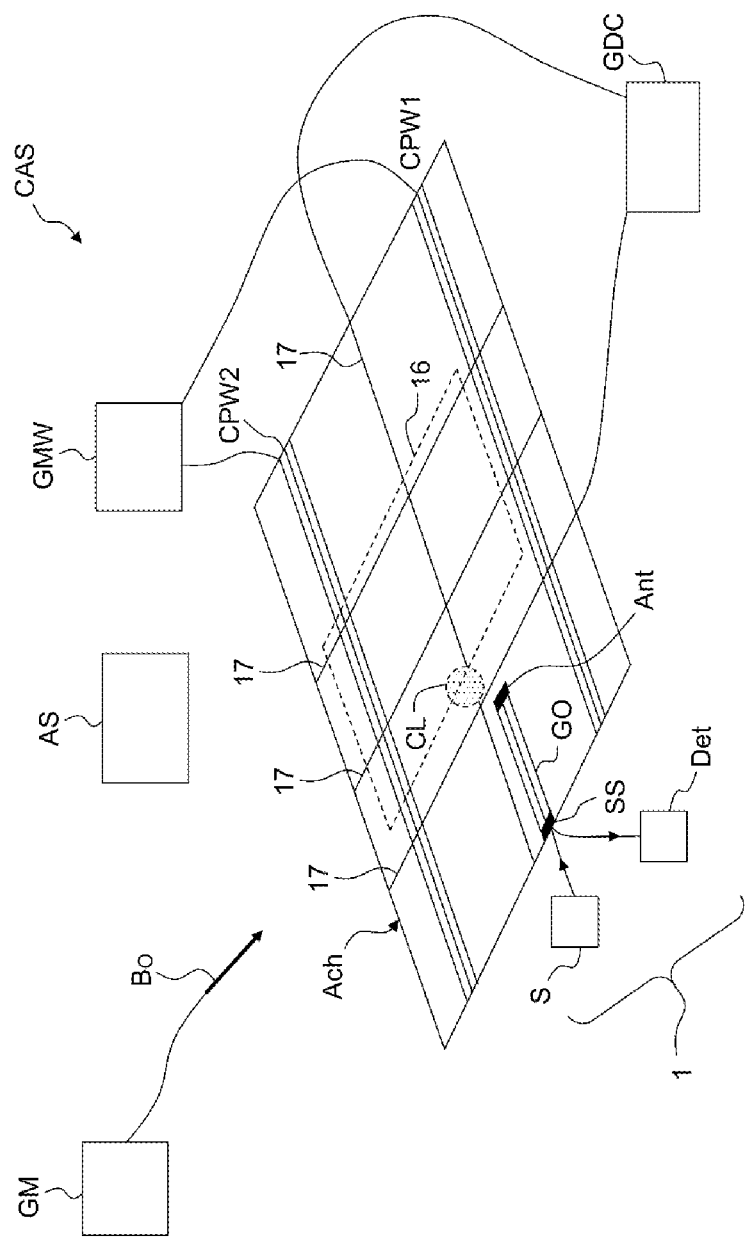
FIG. 12 illustrates a first example of a gyrometer inertial sensor according to the invention.

FIG. 12 illustrates a first example of a gyrometer inertial sensor according to the invention, the operating principle of which is described in document WO 2017089489. The microcircuit here comprises two coplanar microwave guides CPW1 and CPW2 (supplied with power by a generator GMW) and multiple conductive wires 17 (supplied with power by DC voltage or current generators GDC), which make it possible to guide and move the clouds on a substantially rectangular path 16. The device according to the invention is integrated into the sensor, with the antenna Ant, the guide GO and the splitting device SS all integrated on the atom chip Ach, in a plane different from the plane integrating the guides CPW1 and CPW2 and from the plane integrating the wires 17. The antenna Ant is located near and as close as possible to the cloud of cold atoms CL to be analyzed, typically in line with the position of CL.

Figure 13:
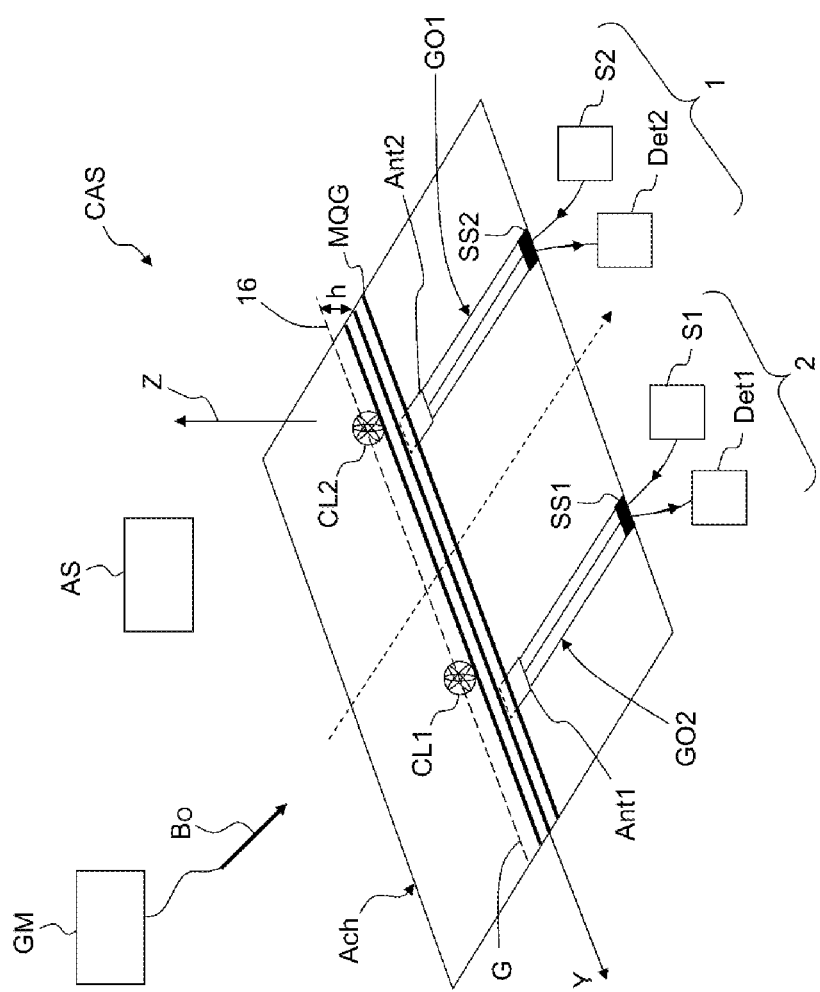
FIG. 13 illustrates a second example of an accelerometer inertial sensor according to the invention.

FIG. 13 illustrates a second example of an accelerometer inertial sensor CAS according to the invention as described in FIG. 1. The microcircuit here comprises a magnetic quadrupole. The path of the two clouds is rectilinear along the axis Y and the two clouds CL1 and CL2 to be analyzed are in motion (free propagation) during and after the recombination. The sensor comprises a first measuring device according to the invention 1 and a second measuring device according to the invention 2. The first device 1 comprises a first microwave source S1, a first microwave guide GO1, a first antenna Ant1, a first splitter device SS1 (all three integrated on the chip Ach) and a first detector D1 and is configured to measure the first representative quantity $\Gamma_{A1}$ by analyzing the cloud CL1. The second device 2 comprises a microwave source S2, a second microwave guide GO2, a second antenna Ant2, a second splitter device SS2 (all three also integrated on the chip Ach) and a second detector D2 and is configured to measure the second representative quantity $\Gamma_{A2}$ by analyzing the cloud CL2. $\Gamma_{A1}$ and $\Gamma_{A2}$ are then measured in parallel with the two devices 1 and 2. Preferably, the antennas are arranged symmetrically about the location in space where the recombination takes place and are located on the path 16, and the measurement is a time-of-flight measurement.

Figure 14:
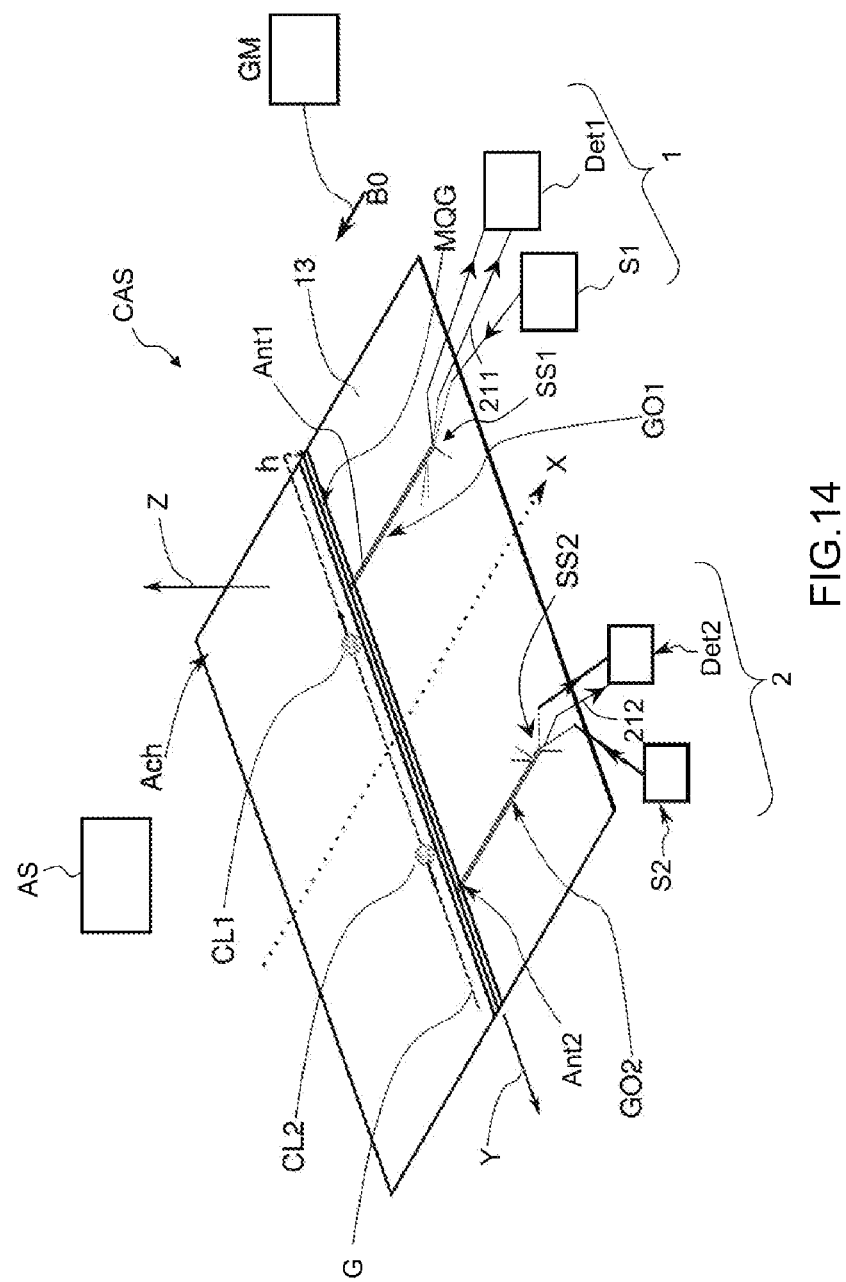
FIG. 14 illustrates one embodiment of the sensor described in FIG. 13 comprising two splitting devices as described in FIG. 11, allowing access to the measurement of the phase of the atomic and reference reflected signals.

According to one embodiment illustrated in FIG. 14, the sensor described in FIG. 13 comprises two splitting devices SS1 and SS2 as described in FIG. 11 (links 211 and 212), allowing access to the measurement of the phase of the atomic and reference reflected signals.

According to another aspect, the invention relates to a method 100 for measuring a quantity representative of a population N of cold atoms occupying a predetermined atomic level, the cold atoms being located in a cloud CL of cold atoms to be analyzed, the method comprising the steps of:

A generating a microwave incident signal SMWi at a predetermined signal frequency fs, B propagating, in a microwave guide, and emitting said incident signal to said cloud of cold atoms, C recovering a reflected signal SMWra resulting from the reflection of the incident signal from said cloud and its environment, called atomic reflected signal, and which propagates in the waveguide in the opposite direction to the incident signal, D extracting at least part of the atomic reflected signal, E detecting said extracted atomic reflected signal SMWra, F before or after steps A to E performed in the presence of the cloud of cold atoms, performing steps A to E in the absence of said cloud, the reflected signal, called reference reflected signal, then resulting from the reflection of the incident signal by the environment in which the cloud evolves, but in the absence of said cloud, G determining said quantity representative of the population of cold atoms N of the atomic level to be analyzed from a detected value $S_A$ of the atomic reflected signal SMWra and from a detected value $S_0$ of the reference reflected signal SMWr0.

Preferably, the implementation of steps A to F in the absence of the cloud is performed after steps A to F in the presence of the cloud.

In a method for measuring an inertial quantity by way of a sensor, the measuring method 100 corresponds to a detection step E5 implemented instead of step E5' described in the prior art and implementing optical beams.

The invention claimed is:

1. A device for measuring a quantity ($\Gamma_A$) representative of a population (N) of cold atoms occupying a predetermined atomic level, said cold atoms being located in a cloud (CL) of cold atoms to be analyzed, the device comprising:
   a microwave source (S) configured to generate an incident signal (SMWi) at a predetermined signal frequency (fs),
   a microwave guide (GO) configured to propagate said incident signal and an antenna (Ant) configured to emit said incident signal to said cloud of cold atoms and its environment,
   said antenna and said microwave guide also being able to recover an atomic reflected signal (SMWra) resulting from a reflection of the incident signal by said cloud and its environment, and which propagates in the waveguide in the opposite direction to the incident signal,
   a splitting device (SS) coupled to the microwave guide and configured to extract at least part of the atomic reflected signal,
   a detector (Det) configured to detect said atomic reflected signal extracted by the splitting device,
   said quantity representative of the population of cold atoms (N) of said predetermined atomic level being obtained from a detected value ($S_A$) of the atomic reflected signal (SMWra) and from a detected value ($S_0$) of a signal reflected by the environment in the absence of said cloud, called reference reflected signal (SMWr0).

2. The device as claimed in claim 1, wherein said representative quantity is proportional to said population.

3. The device as claimed in claim 1, wherein said representative quantity ($\Gamma_A$) is called atomic reflection coefficient and is defined as follows:

$$\Gamma_A = \frac{S_A - S_0}{S_A + S_0}$$

where $S_A$ is the detected value of the atomic reflected signal
$S_0$ is the detected value of the reference reflected signal.

4. The device as claimed in claim 1, wherein the detector is configured to detect atomic and reference reflected powers, said representative quantity (($\Gamma_{PA}$) being determined from said atomic and reference powers.

5. The device as claimed in claim 1, wherein the detector is configured to detect atomic and reference reflected amplitudes, said associated representative quantity ($\Gamma_{AV}$) being determined from said amplitudes, and/or to detect atomic and reference phases, said associated representative quantity ($\Gamma_{A\varphi}$ being determined from said phases.

6. The device as claimed in claim 5, wherein the splitting device (SS) is configured to extract a fraction of the incident signal and the detector (Det) is configured to detect said fraction of the incident signal and to measure said atomic and reference phases.

7. The device as claimed in claim 1, wherein the microwave guide and the antenna are integrated on an atom chip.

8. The device as claimed in claim 1, wherein the signal frequency fs is such that:

$fs \geq fT + f0/2$ where fT is the frequency of the highest detection transition among the possible transitions,
f0 is the separation frequency of two Zeeman sub-levels of said cold atoms.

9. A cold-atom sensor (CAS) comprising:
   an atom chip (Ach) comprising a microcircuit configured to generate a magnetic guide and an atom source (AS), the atom chip and the atom source being placed in a vacuum chamber,
   the sensor being configured to generate an initial cloud of cold atoms comprising atoms having a first atomic level (|a>) and a second atomic level (|b>), to generate and where applicable move, in the opposite direction along a predetermined path, a cloud of cold atoms having said first atomic level and a cloud of cold atoms having said second atomic level, and to recombine said clouds of cold atoms, so as to generate at least one cloud of cold atoms (CL, CL1, CL2) to be analyzed,
   the cold-atom sensor furthermore comprising:
      at least one measuring device as claimed in claim 1 configured to measure a first quantity ($\Gamma_{A1}$) representative of the population (N1) of the first atomic level (|a>) and a second quantity ($\Gamma_{A2}$) representative of the population (N2) of the second atomic level (|b>), a physical quantity being determined from said first and second representative quantities.

10. The sensor as claimed in claim 9, wherein the microwave guide (GO) and said antenna of the measuring device are integrated on said atom chip and wherein said antenna (Ant) is located close to a position of the cloud of cold atoms to be analyzed.

11. The sensor as claimed in claim 10, wherein the splitting device (SS) of the measuring device is also integrated on said atom chip.

12. The sensor as claimed in claim 10, configured to generate a first (CL1) and a second (CL2) cloud of cold atoms to be analyzed in motion, and comprising a first and a second measuring device comprising, respectively, a first (GO1) and a second (GO2) waveguide and a first (Ant1) and a second (Ant2) antenna integrated on said chip, the first measuring device being configured to measure the first quantity ($\Gamma_{A1}$) representative of the first cloud and the second measuring device being configured to measure the second quantity ($\Gamma_{A2}$) representative of the second cloud.

13. A method for measuring a quantity representative of a population (N) of cold atoms occupying a predetermined atomic level, said cold atoms being located in a cloud (CL) of cold atoms to be analyzed,
   the method comprising the steps of:
   A generating a microwave incident signal (SMWi) at a predetermined signal frequency (fs),
   B propagating, in a microwave guide, and, where applicable, emitting said incident signal to said cloud of cold atoms,
   C recovering a reflected signal (SMWra) resulting from the reflection of the incident signal from said cloud and its environment, called atomic reflected signal, and which propagates in the waveguide in the opposite direction to the incident signal,
   D extracting at least part of the atomic reflected signal,
   E detecting said extracted atomic reflected signal (SMWra),
   F before or after steps A to E performed in the presence of the cloud of cold atoms, performing steps A to E in the absence of said cloud, the reflected signal, called reference reflected signal, then resulting from the reflection of the incident signal by the environment wherein the cloud evolves, but in the absence of said cloud, G determining said quantity representative of the population of cold atoms (N) of the atomic level to be analyzed from a value ($S_A$) of the atomic reflected signal (SMWra) and from a value ($S_0$) of the reference reflected signal (SMWr0).

* * * * *